United States Patent
Huang et al.

(10) Patent No.: US 7,678,673 B2
(45) Date of Patent: Mar. 16, 2010

(54) STRENGTHENING OF A STRUCTURE BY INFILTRATION

(75) Inventors: Elbert Huang, Carmel, NY (US); William F. Landers, Wappingers Falls, NY (US); Michael Lane, Cortlandt Manor, NY (US); Eric G. Liniger, Sandy Hook, CT (US); Xiao H. Liu, Briarcliff Manor, NY (US); David L. Questad, Hopewell Junction, NY (US); Thomas M. Shaw, Peekskill, NY (US)

(73) Assignee: International Business Machines Corporation, Armonk, NY (US)

( * ) Notice: Subject to any disclaimer, the term of this patent is extended or adjusted under 35 U.S.C. 154(b) by 240 days.

(21) Appl. No.: 11/832,368

(22) Filed: Aug. 1, 2007

(65) Prior Publication Data

US 2009/0035480 A1     Feb. 5, 2009

(51) Int. Cl.
*B05D 3/12*   (2006.01)
*B05D 3/06*   (2006.01)

(52) U.S. Cl. .................. 438/508; 438/114; 438/458; 438/460; 438/465; 257/620; 257/E21.238; 257/E21.599

(58) Field of Classification Search ............... 438/113, 438/114, 122, 127, 458, 460, 462, 464, 465, 438/623; 257/620, 700, E21.597, E21.599, 257/E21.237, E21.238
See application file for complete search history.

(56) References Cited

U.S. PATENT DOCUMENTS

| | | | |
|---|---|---|---|
| 6,333,064 B1 * | 12/2001 | Gan .............................. | 427/58 |
| 7,064,014 B2 * | 6/2006 | Dias et al. .................... | 438/122 |
| 2008/0166870 A1 * | 7/2008 | Huang et al. ................. | 438/619 |

* cited by examiner

*Primary Examiner*—Victor A Mandala
*Assistant Examiner*—Whitney Moore
(74) *Attorney, Agent, or Firm*—Scully, Scott, Murphy & Presser, P.C.; Louis J. Percello, Esq.

(57) ABSTRACT

The present invention provides a method of strengthening a structure, to heal the imperfection of the structure, to reinforce the structure, and thus strengthening the dielectric without compromising the desirable low dielectric constant of the structure. The inventive method includes the steps of providing a semiconductor structure having at least one interconnect structure; dicing the interconnect structure; applying at least one infiltrant into the interconnect structure; and infiltrating the infiltrant to infiltrate into the interconnect structure.

20 Claims, 2 Drawing Sheets

STRENGTHENING OF A STRUCTURE BY INFILTRATION

FIELD OF THE INVENTION

The present invention generally relates to structures, and particularly to a semiconductor structure having enhanced strength, and methods of manufacturing the same.

BACKGROUND OF THE INVENTION

Lower dielectric constant materials are desirable in semiconductor chip manufacture to reduce signal propagation delays and crosstalk in back-end-of-the-line (BEOL) and packaging interconnects. A reduction in dielectric constant invariably results in a corresponding reduction in a dielectric fracture resistance. This is particularly true with brittle oxide-like dielectrics where fracture resistance is directly related to bond density and strength. In particular, delaminations can occur around the chip with metal structures requiring redesign of the kerf region of the chip, which restricts the area available for kerf test structures.

One consequence of this reduction in fracture resistance is that with recent dielectrics the fracture resistance of BEOL structures has become lower than that of the silicon substrate on which they are fabricated. Thus, imperfections introduced into the chip structure by processes such as chip dicing and wire bonding preferentially propagate through BEOL interconnect structures causing chip failure.

Generally, the semiconductor chip is further attached and connected to a packaging structure by different processes such as C4 chip attachment or wire bonding. Because of different thermal expansion properties during thermal cycling of different materials in the packaged chip, the complex arrangement of materials in the packaging structure can produce significant stresses in the chip during a packaging process and/or under a use condition. These forces or stresses, are typically concentrated, and can cause an existing structure imperfection to become unstable and propagate.

Certain stress relief materials may be used in such packages. However, under most circumstances, materials are chosen to optimize other functions, such as electrical performance, or C4 fatigue life of the package and thus cannot be designed solely to reduce the stresses on the chip. Further, significant shear or tensile stresses are usually applied to the edge of a packaged chip. Thus, there is a need for providing a structure, which avoids chip packing interaction (CPI) failures due to propagation of pre existing cracks or other imperfections into active areas of the chip.

One approach is to increase the intrinsic toughness of the dielectric itself. As discussed above, this cannot be done throughout the chip without increasing the effective dielectric constant and hence compromising electrical performance. To increase the resistance to propagation of CPI cracks without affecting the chip's electrical performance, strengthening of the dielectric must be achieved locally at the perimeter of the chip. This could be achieved by applying separate masking and processing steps to the edge of the chip. However, such an approach is expensive and thus undesirable.

Another approach to inhibit the propagation of structure imperfections is to reduce the stresses at the tip of the structure imperfection so that a critical fracture stress can not be reached. This can be done by special design of the package with limited options.

In view of the above, there exists a need for a structure having enhanced resistance to crack propagation in the back-end-of-line dielectric materials and methods of manufacturing the same.

SUMMARY OF THE INVENTION

The present invention relates to a method of strengthening a structure by infiltrating the structure with an infiltrant, strengthening the interconnect dielectric material with the structure, healing the imperfection of the structure, reinforcing the structure, and thus strengthening the structure without compromising the desirable low dielectric constant of the structure.

One of the embodiments of the present invention provides a method of strengthening a structure, which comprises:

providing a structure having at least one interconnect structure located therein;

dicing the structure including at least one interconnect structure;

applying at least one infiltrant to an exposed edge of at least one interconnect structure; and infiltrating the infiltrant into at least one interconnect structure.

Another embodiment of the present invention provides a method of strengthening a structure, which comprises:

providing a structure having at least one interconnect structure;

partially dicing the structure including at least one interconnect structure;

forming a plurality of chip-dicing channels inboard;

applying at least one infiltrant to at least one of the chip-dicing channels;

infiltrating at least one infiltrant into at least one interconnect structure; and dicing at least one interconnect structure into a plurality of chips.

According to the present invention, the structure may include, a semiconductor substrate, a chip or a package.

Generally, the infiltrant that is employed in this invention has a low molecular weight from about 1000 to about 30000 grams/mole and is capable of facilitating penetration of pores of a dielectric material that is present in at least one interconnect structure.

In one aspect of the invention, the infiltrant comprises crosslinking groups and reactive groups.

In another aspect of the invention, the infiltrant is a polymeric system or a polymer precursor. The polymeric system is, for example, a solvent mediated polymeric system or in a liquid state. The polymer precursor may further comprise at least one other material, such as, a UV initiator, a thermal initiator, a crosslinking agent, an interlayer dielectric (ILD) reactive group, or any combination thereof.

In yet another aspect of the invention, the structure of this invention is bonded to a package with other materials, for example, a bonding agent or a second compound.

DETAILED DESCRIPTION OF THE INVENTION

The present invention, which provides a method of strengthening a structure, to heal imperfections in the structure by infiltrating the structure with an infiltrant, to reinforce the structure, and thus strengthen the interconnect dielectric within the structure, without compromising the desirable low dielectric constant of the structure, will now be described in greater detail by referring to the following discussion and drawings that accompany the present application. It is noted that the drawings of the present application are provided for illustrative purpose only and, as such, the drawings are not drawn to scale.

In the following description, numerous specific details are set forth, such as particular structures, components, materials, dimensions, processing steps and techniques, in order to provide a thorough understanding of the present invention. However, it will be appreciated by one of ordinary skill in the art that the invention may be practiced without these specific details. In other instance, well-known structures or processing steps have not been described in detail in order to avoid obscuring the invention.

It will be understood that when an element as a layer, region or structure is referred to as being "in" or "into" another element, it can be directly on the other element or intervening elements may also be present.

Figure 1A:
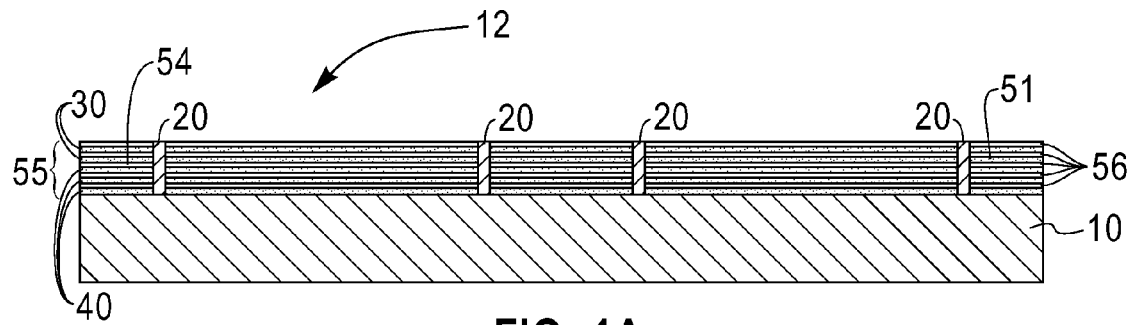
FIGS. 1A-1D are pictorial representations (through cross sectional views) illustrating the method of strengthening of a structure in accordance with one embodiment of the present invention.

FIGS. 1A-1D are sequential cross section pictorial representations (through cross sectional views) illustrating the method of strengthening a semiconductor structure. Specifically, referring to FIG. 1A, an initial semiconductor structure 12 comprises a substrate layer 10, a plurality of barriers 20, and a back-end-of-line (BEOL) stack 55 comprising an interconnect dielectric material 40, far-back-end-of-line (FBEOL) dielectric layers 30, and BEOL metal wiring layers 56. Original edges 51 and 54 are shown in FIG. 1A.

The interconnect dielectric material 40 may comprise any interlevel or intralevel dielectric including inorganic dielectrics or organic dielectrics. The interconnect dielectric material 40 may be porous or non-porous. Some examples of suitable dielectrics that can be used as the dielectric material 40 include, but are not limited to: $SiO_2$, silsesquioxanes, C doped oxides (i.e., organosilicates) that include atoms of Si, C, O and H, thermosetting polyarylene ethers, or multilayers thereof. The term "polyarylene" is used in this application to denote aryl moieties or inertly substituted aryl moieties which are linked together by bonds, fused rings, or inert linking groups such as, for example, oxygen, sulfur, sulfone, sulfoxide, carbonyl and the like.

The interconnect dielectric material 40 typically has a dielectric constant that is about 4.0 or less, with a dielectric constant of about 2.8 or less being even more typical. All dielectric constants mentioned herein are relative to a vacuum, unless otherwise noted. These dielectrics generally have a lower parasitic cross talk as compared with dielectric materials that have a higher dielectric constant than 4.0. The thickness of the interconnect dielectric material 40 may vary depending upon the dielectric material used as well as the exact number of dielectrics layers within the interconnect dielectric material 40. Typically, and for normal interconnect structures, the interconnect dielectric material 40 has a thickness from about 50 to about 1000 nm.

Figure 1B:
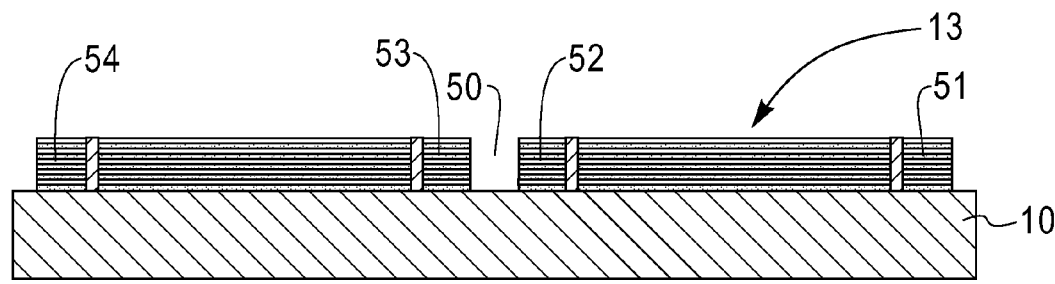

Referring to FIG. 1B, an incompletely diced semiconductor structure 13 comprises two original edges 51 and 54, two newly incompletely diced edges 52 and 53, and an inboard dicing channel 50 in between edges 52 and 53.

Figure 1C:
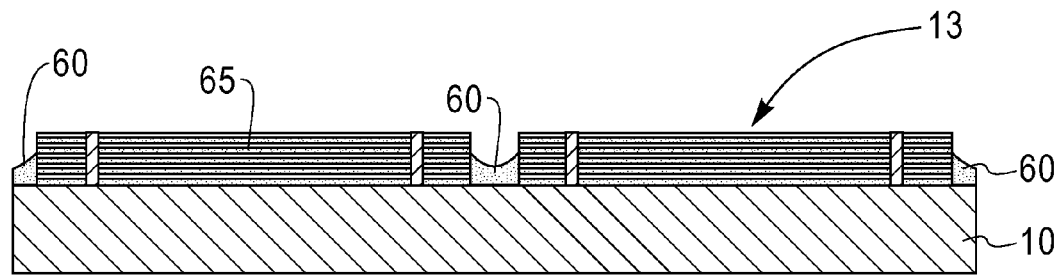
Figure 1D:
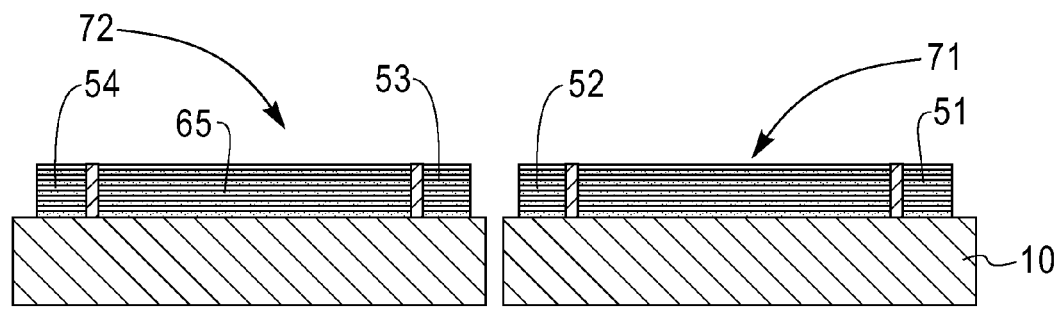

Alternatively, referring to FIGS. 1B and 1D, an incompletely diced semiconductor structure wherein a dicing channel 50 is further diced completely forming two separate diced chips 71 and 72, wherein chip 71 comprises original edge 51 and newly diced edge 52 and chip 72 comprises original edge 54 and newly diced edge 53. The dicing may be performed by different methods that are well known to those skilled in the art. Usually, the dicing is performed using a standard cutting process such as diamond sawing or laser cutting.

Referring to FIG. 1B, the edges 51, 52, 53, and 54 may comprise at least one structure imperfection. The structure imperfection may be caused by various reasons, such as sharp cracks or interface delaminations that occur at the diced edge of a semiconductor structure. The structure imperfection may also be caused by wire bonding processes.

Referring to FIG. 1C, the infiltrant 60 may be applied to the edges of 51, 52, 53, and 54 of an incompletely diced semiconductor structure 13. Next, referring to FIG. 1D, semiconductor structure 13 is further diced into two separate chips 71 and 72.

According to another embodiment of the present invention, referring to FIGS. 1A and 1D, the provided semiconductor structure 12 is completely diced forming two separate chips 71 and 72, without the step as shown in FIG. 1C, and the infiltrant 60 is further applied to edges 51, 52, 53, and 54.

Referring to FIGS. 1C and 1D, movement of infiltrant 60 into the electrical active area 65 of the BEOL structure 55 is prevented by a plurality of barriers 20. Each barrier 20 is a blocking material for preventing penetrating of infiltrant 60 into the electrical active area 65. For example, each barrier 20 is metal crackstop or moisture oxidation barrier. A crackstop may comprise a structure that is constructed with the circuit interconnect elements; e.g., horizontal interconnect elements in the substrate, to stop the crack within the substrate. A moisture oxidation barrier may comprise a structure that is constructed for preventing moisture/oxidation contaminants from reaching active circuit regions 65.

Preferably, the method in the present invention can heal an imperfect structure and reinforce the edges of a semiconductor structure, without creating any new structure imperfections in the BEOL structure.

Figure 2A:
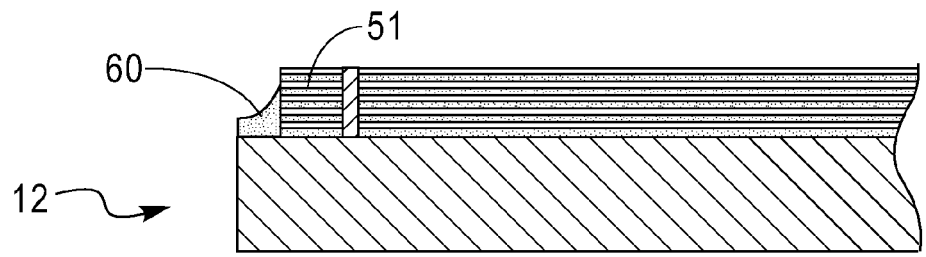
FIG. 2A is a pictorial representation (through cross sectional views) illustrating an application of the method shown in FIG. 1C through one embodiment of the present invention.

Several examples of applicable semiconductor structures by the method of the present invention are shown in FIGS. 2A-AC. Referring to FIG. 2A, in one embodiment of the present invention, the infiltrant 60 is applied to an edge 51 of a provided semiconductor structure up to a barrier 20, which prevents the infiltrant 60 from penetrating into the center of the chip where the active circuits lie.

Figure 2B:
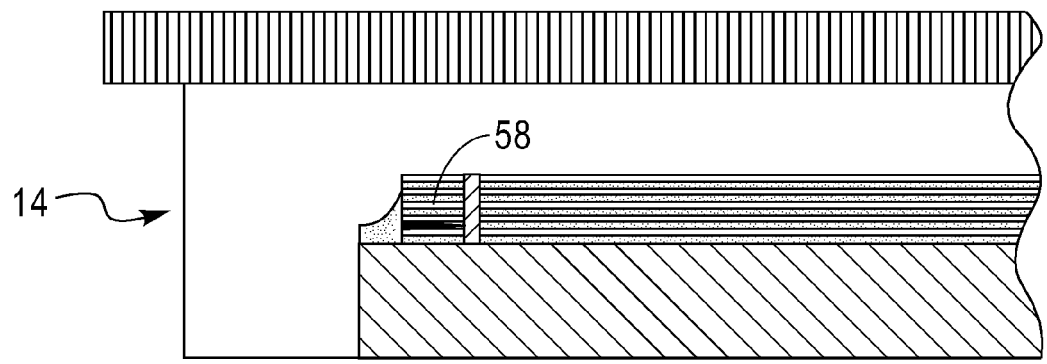
FIG. 2B is a pictorial representation (through cross sectional views) illustrating an alternative application of the method shown in FIG. 1C through another embodiment of the present invention.

Referring to FIG. 2B, according to another embodiment of the present invention, the infiltrant 60 only penetrates into structure imperfections at the edge 58 of the chip wherein the chip is bonded to a package 14 using an bonding agent which is different than the infiltrant 60. In this case the infiltrant may or may not penetrate the dielectric materials.

Figure 2C:
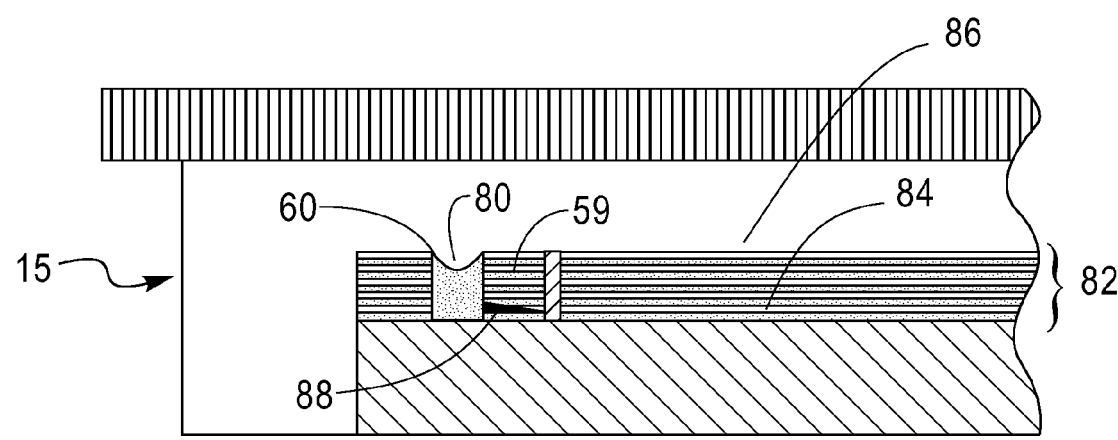
FIG. 2C is a pictorial representation (through cross sectional views) illustrating an alternative application of the method shown in FIG. 1C through yet another embodiment of the present invention.

Referring to FIG. 2C, in yet another embodiment of the present invention, a chip 86, bonded to a package 15, is provided. A trench 80 is cut in the BEOL structure 82 of chip 86. The infiltrant 60 is applied to a diced edge 59 to prevent the propagation of a crack 88 from entering into the center of the chip 84 as shown in FIG. 2C. In this case the infiltrant may or may not penetrate the dielectric materials.

The semiconductor package 14 or 15 is formed via a bonding process wherein the semiconductor chip is bonded with at least a second material. The second material, for example, may comprise a bonding agent or a second compound. Preferably, the second material is not the same material as the infiltrant. The bonding agent, for example, may be an adhesive, such as an epoxy or certain type of metallurgy.

The infiltrant 60 typically has low molecular weight from about 1000 to about 30000 grams/mole, and is capable of facilitating penetration of pores of a dielectric material that is present in at least one interconnect structure.

The infiltrant 60 may comprise crosslinking groups wherein the infiltrant enhances molecular properties of the dielectric material 40. The crosslinking groups may be introduced by a thermal annealing method or by an UV irradiation method.

The thermal annealing process is a process used in semiconductor device fabrication, which consists of heating a singe wafer at a time in order to affect its electrical properties. A continuous heating at a constant temperature or various ramping in temperature may be employed. Unique heat treatments are designed for different effects. Wafers can be heated in order to activate dopants, change film-to-film or film-to-wafer substrate interfaces, densify deposited films, change states of grown films, repair damage from ion implantation, move dopants or drive dopants from one film into another or from a film into the wafer substrate.

The infiltrant 60 may comprise reactive groups wherein the reactive group may provide covalent binding to enhance adhesion. For example, the reactive group, capable of reacting with silanol, is hydroxy, carboxy or silanol, etc.

The infiltrant 60 may comprise a polymeric system. For example, the polymeric system is solvent mediated. The solvent, for example, is propylene glycol methyl ether acetate (PGMEA), propylene glycol methyl ether (PGME), toluene, xylenes, anisole, mesitylene, butyrolactone, cyclohexanone, hexanones, ethyl lactate, heptanones, alcohols, cyclic ethers, and cyclic ketones, etc. The solvent may facilitate pore and crack penetration of polymeric system and further be removed by evaporation with or without heating.

According to another embodiment of the present invention, the polymeric system, below the glass transition temperature (Tg), is in a liquid state with no need for any solvents, examples of a polymeric system are polysiloxanes, polysilazanes, polyethers, polyurethanes, and polyesters.

The infiltrant 60 may comprise polymeric precursors. For example, the polymeric precursor is a monomer. Further, the polymeric precursor may be polymerized by free radical chain polymerization, such as styrenics, methacrylates, acrylates, and vinyl monomers.

The polymer precursors may further proceed with an additional condensation or polymerization process, for instance, with epoxy, a typical polyurethane.

The polymeric precursor may also further comprise initiators such as an UV initiator or a thermal initiator. Initiator refers to a chemical compound used to start a chain reaction. Chemical compound initiators, usually form a free radicalan atom or molecule with at least one unpaired electron, or a group of atoms, charged or uncharged, that act as a single entity in reaction. Examples of UV or thermal initiator are, without limitation, azoisobutyronitrile and benzoyl peroxide.

The polymeric precursor may further comprise at least one crosslinking agent. A crosslinking agent is a substance that promotes or regulates intermolecular covalent bonding between polymer chains, linking them together to create a more rigid structure. The crosslinking agent, for example, is one of divinylbenzene, trifunctional, and tetrafunctional groups, etc.

The polymeric precursor may also further comprise at least one interlayer dielectric (ILD) reactive group. An ILD is an insulator material between each metal layer or between the first metal layer and silicon and is same as interlevel dielectric. The interlayer dielectric material may comprise an oxide, a low-k CVD dielectric material, and/or a spin-on low-k dielectric material. The oxide may be an undoped silicate glass (USG), borosilicate glass (BSG), phosphosilicate glass (PSG), fluorosilicate glass (FSG), borophosphosilicate glass (BPSG), or a combination thereof. Various low-k CVD dielectric materials and spin-on dielectric materials are known in the art as well.

The polymeric precursor may comprise a combination of at least one UV or thermal initiator, crosslinking agent, and ILD reactive groups.

There are various ways for applying infiltrant 60 to the edges of a semiconductor substrate. One of the embodiments of the present invention is to apply the infiltrant 60 in a liquid form, such as a polymeric solution, a liquid polymeric material, or monomer precursors, directly into the semiconductor substrate via an instrument. The instrument, for example, is a syringe, a brush, aerosol or a vapor process. The vapor process is a chemical vapor deposition process as shown in FIG. 1C.

According to another embodiment of the present invention, the application of the infiltrant 60 may further comprise a cure process wherein the infiltrant 60 is converted to solid material with preferable properties, such as preferred mechanical property. Thus, infiltrant 60 is applied to the semiconductor structure in a uniform application followed by localized curing. For example, the infiltrant is applied by spin coating and further is crosslinked in selected regions by laser annealing or UV irradiation. Finally, uncured materials are removed. Other deposition processes such as, for example, chemical vapor deposition and plasma enhanced chemical vapor deposition, are not however excluded.

Yet another embodiment of the present invention for applying infiltrant 60 to the semiconductor structure is to introduce the infiltrant, for example, monomeric precursors, via vapor phase at sufficient partial pressure. This method is likely to result in capillary condensation of monomeric precursors in pores that are accessible, for example, porous ILD that is exposed in precut regions. After the pores are filled, monomeric precursors are polymerized or crosslinked by UV exposure on thermal anneal.

One skilled in the art would recognize that the other kinds of semiconductor structures may be employed. Further, the infiltrant 60 may be applied to a semiconductor structure with or without any structure imperfection to strengthen the edges of the semiconductor structures. Also, according to different needs of the semiconductor structures, different kinds of infiltrant 60 may be applied to different edges in the same semiconductor structure. Such applications are herein explicitly contemplated.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A method of strengthening a structure, which comprises:
providing a structure having at least one interconnect structure located therein;
dicing said structure including the at least one interconnect structure;
applying at least one infiltrant to at least one exposed sidewall edge of said at least one interconnect structure, said at least one infiltrant does not extend onto an upper or lower surface of the at least one interconnect structure; and
infiltrating said at least one infiltrant into said at least one interconnect structure.

2. The method of claim 1, wherein said dicing provides a plurality of semiconductor chips.

3. The method of claim 1, wherein the structure is partially diced forming a plurality of chip-dicing channel inboard and separating said structure into a plurality of chips.

4. The method of claim 1, further comprising at least one barrier within the at least one interconnect structure, said at least one barrier is a metal crackstop or a moisture oxidation barrier.

5. The method in claim 1, wherein said structure includes a semiconductor substrate, a chip or a package.

6. The method of claim 1, wherein said at least one infiltrant penetrates into structure imperfections located in the at least one sidewall edge of the at least one interconnect structure.

7. The method of claim 1 wherein said at least one infiltrant has a low molecular weight from about 1000 to about 30000 grams/mole, and is capable of facilitating penetration into pores of a dielectric material that is present in the at least one interconnect structure.

8. The method of claim 1, wherein said at least one infiltrant comprises crosslinking groups and said at least one inifitrant enhances molecular properties of at least one dielectric material present in the at least one interconnect structure.

9. The method of claim 8, wherein said crosslinking groups is introduced by a thermal annealing method or an UV irradiation method.

10. The method of claim 9, further comprising incorporating reactive groups to said at least one infiltrant.

11. The method of claim 1, wherein said at least one infiltrant is a polymeric system.

12. The method of claim 11, wherein said polymeric system is solvent mediated.

13. The method of claim 11, wherein said polymeric system is in a liquid state.

14. The method of claim 1, wherein said at least one infiltrant is a polymeric precursor.

15. The method of claim 14, wherein polymerization of said polymeric precursor proceeds free radical chain polymerization or condensation polymerization.

16. The method of claim 14, wherein said polymeric precursor further comprises an UV initiator or a thermal initiator.

17. The method of claim 14, wherein said polymeric precursor further comprises at least one crosslinking agent.

18. The method of claim 14, wherein said polymeric precursor further comprises at least one ILD reactive group.

19. The method in claim 1, wherein said at least one interconnect structure is bonded to a package using at least one second material.

20. A method of strengthening a structure, which comprises:
providing a structure having at least one interconnect structure located therein;
dicing said structure including at least one interconnect structure completely;
forming a plurality of chips;
applying at least one infiltrant to at least one exposed sidewall edge of said plurality of chips, said at least one infiltrant does not extend onto an upper or lower surface of the plurality of chips; and
infiltrating said at least one infiltrant into said plurality of chips.

* * * * *